United States Patent
Koo et al.

(10) Patent No.: US 10,192,678 B2
(45) Date of Patent: Jan. 29, 2019

(54) CURRENT TRANSFORMER SYSTEM WITH SENSOR CT AND GENERATOR CT SEPARATELY ARRANGED IN PARALLEL IN ELECTRIC POWER LINE, AND INTEGRATED SYSTEM FOR CONTROLLING SAME IN WIRELESS COMMUNICATIONS NETWORK

(71) Applicant: FERRARISPOWER CO., LTD, Gyeonggi-do (KR)

(72) Inventors: Ja-Il Koo, Seongnam-si (KR); Tae-Kyoung Kim, Incheon (KR)

(73) Assignee: FERRARISPOWER CO., LTD, Gyeonggi-do (KR)

( * ) Notice: Subject to any disclaimer, the term of this patent is extended or adjusted under 35 U.S.C. 154(b) by 447 days.

(21) Appl. No.: 14/769,796

(22) PCT Filed: Feb. 20, 2014

(86) PCT No.: PCT/KR2014/001374
§ 371 (c)(1),
(2) Date: Aug. 21, 2015

(87) PCT Pub. No.: WO2014/129817
PCT Pub. Date: Aug. 28, 2014

(65) Prior Publication Data
US 2016/0005534 A1    Jan. 7, 2016

(30) Foreign Application Priority Data

Feb. 21, 2013  (KR) ........................ 10-2013-0018739
May 10, 2013  (KR) ........................ 10-2013-0053188

(51) Int. Cl.
*H01F 27/42*      (2006.01)
*H02J 7/00*       (2006.01)
(Continued)

(52) U.S. Cl.
CPC ......... *H01F 27/427* (2013.01); *G01R 15/183* (2013.01); *G01R 15/186* (2013.01);
(Continued)

(58) Field of Classification Search
CPC combination set(s) only.
See application file for complete search history.

(56) References Cited

U.S. PATENT DOCUMENTS 4,620,140 A * 10/1986 Chonan ...................... G05F 1/67
136/291
5,426,360 A *  6/1995 Maraio ................ G01R 15/142
324/126

(Continued)

FOREIGN PATENT DOCUMENTS

JP      H06-58960 A      3/1994
JP      08-201437 A      8/1996
(Continued)

OTHER PUBLICATIONS

WIPO, Korean International Search Authority, International Search Report dated Apr. 3, 2014 in International Patent Application No. PCT/KR2014/001374 (with translation), 2 pages.

*Primary Examiner* — Nay A Maung
*Assistant Examiner* — Erica L Fleming-Hall
(74) *Attorney, Agent, or Firm* — Masuvalley & Partners (57) ABSTRACT

A current transformer system according to the present invention includes: a sensor CT detachably attached to an electric power transmission/distribution line for detecting the current flowing through the power line by means of electromagnetic induction; a generator CT detachably attached to an electric power transmission/distribution line for generating power by means of electromagnetic induction; and a microprocessor for controlling the sensor CT and the generator CT. According to the present invention, the generator CT is used as the main power source so as to perform (Continued)

independently power supply and facilitate the construction of an additional source in need of additional power.

8 Claims, 6 Drawing Sheets

(51) Int. Cl.
    *H01F 38/20*      (2006.01)
    *H04W 4/00*      (2018.01)
    *H01F 38/16*      (2006.01)
    *H01F 27/02*      (2006.01)
    *H04B 5/00*      (2006.01)
    *G01R 31/02*      (2006.01)
    *H01F 38/14*      (2006.01)
    *H04W 4/80*      (2018.01)
    *G01R 15/18*      (2006.01)
    *H04W 84/12*      (2009.01)

(52) U.S. Cl.
    CPC .......... *G01R 31/027* (2013.01); *H01F 27/02* (2013.01); *H01F 38/14* (2013.01); *H01F 38/16* (2013.01); *H01F 38/20* (2013.01); *H02J 7/0068* (2013.01); *H04B 5/0043* (2013.01); *H04B 5/0075* (2013.01); *H04W 4/80* (2018.02); *H04W 84/12* (2013.01)

(56) References Cited

U.S. PATENT DOCUMENTS

| | | | | |
|---|---|---|---|---|
| 6,091,223 | A * | 7/2000 | Rogers | B60L 3/0069 320/111 |
| 6,092,027 | A * | 7/2000 | Takai | G01R 31/001 324/613 |
| 6,433,981 | B1 * | 8/2002 | Fletcher | G01R 19/0092 323/234 |
| 6,470,283 | B1 * | 10/2002 | Edel | G01R 19/2513 324/72.5 |
| 7,242,157 | B1 * | 7/2007 | Edel | G01R 15/185 315/362 |
| 8,604,805 | B2 * | 12/2013 | Satou | G01R 31/027 324/547 |
| 9,188,610 | B1 * | 11/2015 | Edel | G01R 15/183 |
| 2003/0045946 | A1 * | 3/2003 | Hattori | G05B 23/0264 700/27 |
| 2005/0156587 | A1 * | 7/2005 | Yakymyshyn | G01R 15/207 324/117 R |
| 2006/0202664 | A1 * | 9/2006 | Lindsey | H02J 5/005 320/137 |
| 2006/0256921 | A1 * | 11/2006 | Tachibana | A61B 6/14 378/116 |
| 2008/0084201 | A1 * | 4/2008 | Kojori | G01R 19/0015 324/117 R |
| 2009/0003022 | A1 * | 1/2009 | Nunoya | B60L 5/005 363/78 |
| 2009/0072813 | A1 * | 3/2009 | Banhegyesi | G01R 15/183 324/127 |
| 2009/0102437 | A1 * | 4/2009 | Nakagawa | H02P 9/48 323/217 |
| 2009/0219009 | A1 * | 9/2009 | Jansen | G01R 15/183 324/127 |
| 2010/0013457 | A1 * | 1/2010 | Nero, Jr. | G01R 15/142 324/119 |
| 2010/0085036 | A1 * | 4/2010 | Banting | G01R 15/14 324/127 |
| 2010/0254057 | A1 * | 10/2010 | Chen | H02H 3/04 361/91.2 |
| 2011/0156698 | A1 * | 6/2011 | Cook | G01R 15/185 324/127 |
| 2012/0029718 | A1 * | 2/2012 | Davis | G05B 15/02 700/295 |
| 2012/0039062 | A1 * | 2/2012 | McBee | H01F 27/06 361/825 |
| 2012/0161533 | A1 * | 6/2012 | Urano | H02J 17/00 307/104 |
| 2012/0218114 | A1 * | 8/2012 | Davis | G01R 19/2513 340/646 |
| 2012/0236611 | A1 * | 9/2012 | Alexandrov | H02M 7/155 363/126 |
| 2012/0248936 | A1 * | 10/2012 | Hsieh | G01R 15/183 310/339 |
| 2012/0271579 | A1 * | 10/2012 | Deokar | G01R 19/2513 702/64 |
| 2015/0137596 | A1 * | 5/2015 | Steiner-Jovic | G01R 15/186 307/24 |

FOREIGN PATENT DOCUMENTS

| | | |
|---|---|---|
| JP | H11-502313 A | 2/1999 |
| JP | 2001-033491 A | 2/2001 |
| JP | 2007-507999 A | 3/2007 |
| KR | 2010-0043834 A | 4/2010 |
| KR | 2011-0043059 A | 4/2011 |
| KR | 2012-0038048 A | 4/2012 |

* cited by examiner

CURRENT TRANSFORMER SYSTEM WITH SENSOR CT AND GENERATOR CT SEPARATELY ARRANGED IN PARALLEL IN ELECTRIC POWER LINE, AND INTEGRATED SYSTEM FOR CONTROLLING SAME IN WIRELESS COMMUNICATIONS NETWORK

RELATED APPLICATIONS

This application is the U.S. National Phase of and claims priority to International Patent Application No. PCT/KR2014/001374, International Filing Date Feb. 20, 2014, entitled Current Transformer System With Sensor CT And Generator CT Separately Arranged In Parallel In Electric Power Line, And Integrated System For Controlling Same In Wireless Communications Network (as translated), which claims benefit of Korean Application No. KR10-2013-0018739, filed Feb. 21, 2013 entitled Current Transformer System Including Structure Of Sensor CT And Structure Of Generator CT Mounted In Parallel On Electric Power Line, And Integrated Wireless Communication System Monitoring The Same (as translated); and Korean Application No. 10-2013-0053188, filed May 10, 2013 entitled Current Transformer (as translated); all of which are incorporated herein by reference in their entireties.

TECHNICAL FIELD

The present disclosure relates to a current transformer (CT) system in which a sensor CT and a generator CT are installed in parallel to each other at an interval on a wire and an integrated system managing the same through a wireless communication network, and more particularly, to a current transformer system in which a sensor CT and a generator CT are installed in parallel to each other at an interval on a wire, where the sensor CT sensing an abnormal current by using electromagnetic induction and the generator CT generating power by using the electromagnetic induction as well are manufactured, they are formed in individual structures and installed in parallel to each other at a certain interval without mutual interference, and the generator CT is installed in plurality in parallel to each other according to an amount of power required by the sensor CT, has a ring-type structure formed by using a clamp to facilitate attachment to the wire in addition of the wire, arbitrarily removes magnetism from the core of the structure for detachment in replacement to enable easy maintenance, and includes a communication function in the structure to form a network with a typical integrated management system and thus monitor the status of the wire in real time, and an integrated system managing the same through a wireless communication network.

BACKGROUND ART

In general, a power transmission/distribution wire or a power supply system similar thereto senses only whether a voltage or current is abnormal, by the installation of a potential transformer or current transformer on the secondary side of a transformer in order to sense an abnormal current or check the current power transmission/distribution state. Also, in the case of a high voltage, sensing only whether a current flowing at a metering out fit (MOF) terminal is abnormal and transmitting it wirelessly are partially applied to sites.

However, the above-described current transformer has the following limitations.

Firstly, since current sensing CT used as a sensor is not suitable for charging a battery, there is a need to use a battery used as a main power source. To this end, there is an attempt to use a portion of the current sensing CT but it causes the interference between the core of a power generating CT and the core of a current sensing CT.

Secondly, there is an attempt to form the core of the power generating CT and the core of the current sensing CT separately to prevent electrical interference. However, since such a case also employs coupling two cores to a single structure, there are many limitations in simultaneously coupling without a gap when the two separable cores are installed at a wire.

Thirdly, when the above-described magnetic structure is demolished in order to change the installation section of the current sensing CT, it is difficult to separate a magnetic core based structure with a physical force when a wire current is equal to or higher than a certain level, thus maintenance is difficult. In particular, when used for the power generating CT, there is a limitation in that there is a need to interrupt a current on a typical wire when the structure is demolished.

Fourthly, since the main function of the above methods is sensing an abnormal current, there is a limitation in monitoring a wire current and a voltage state in addition to the abnormal current in real time.

DISCLOSURE OF THE INVENTION

Technical Problem

Embodiments provide a power generating CT and a current sensing CT that enable attachment and detachment so that maintenance is easy.

Embodiments also provide a power generating CT and a current sensing CT in separate structures in order to eliminate mutual interference and improve assembly performance.

Embodiments also provide a system that may monitor a wire load in real time by using a wireless communication network and open or close an abnormal section by a control command remotely when there is an error.

Technical Solution

In one embodiment, a current transformer (CT) system includes a sensor CT installed detached/attached from/to a power transmission/distribution wire and detecting a current flowing through the wire by electromagnetic induction, a generator CT installed detached/attached from/to the power transmission/distribution wire and generating power by electromagnetic induction, and a microprocessor controlling the sensor CT and the generator CT.

In another embodiment, a current transformer (CT) system includes a clamp-type sensor CT structure detached/attached from/to a power transmission/distribution wire, and a clamp-type generator CT structure detached/attached from/to the wire and installed in parallel to the sensor CT at an interval, wherein each of the structures includes a top assembly and a bottom assembly, each including a core and a coil therein, a hinge installed on one side of the top assembly and the bottom assembly, and a lock clip installed on another side of the top assembly and the bottom assembly.

In further another embodiment, a wireless integrated system includes one or more current transformer (CT) systems installed on a power transmission/distribution wire, and an integrated system using a wireless communication network to form a network with the CT systems, wherein the CT systems include: a sensor CT detecting a current through the wire by electromagnetic induction, a generator CT generating contactless, independent power by using electromagnetic induction, and a communication module.

Advantageous Effects

As described above, the following effects may be expected according to a configuration of the present disclosure.

Firstly, since a separable generator CT is used as a main power source, it is possible to independently supply power and since it is possible to easily secure necessary power by quantitatively adding as many generator CTs as desired when necessary, the effect of power supply convenience being maximized is obtained.

Secondly, in addition to an negligent accident prevention function such as an earth leakage circuit breaker that senses an abnormal current on a wire to interrupt the current on the wire, it is possible to check an amount of power on the wire in real time and thus it is effective for monitoring the general power usage state of a power transmission/distribution system.

Thirdly, since it is possible to transmit a wire state or exchange control information in real time through addition of a wireless communication function to a sensor CT, there is an effect in that it is possible to apply to a typical wireless wire monitoring system and a system similar thereto as it is.

Fourthly, since it is possible to separate a generator CT from a wire in a state in which the generator CT is installed as a normal power source if necessary, it is possible to maximize the safety of a worker, manage and maintain a current transformer system without a change in the power state of a consumer such as power failure and thus it is possible to satisfy consumer's needs.

MODE FOR CARRYING OUT THE INVENTION

The advantages and features of the present disclosure, and implementation methods thereof will be clarified through the following embodiments described with reference to the accompanying drawings. The present disclosure may, however, be embodied in different forms and should not be construed as limited to the embodiments set forth herein. Rather, these embodiments are provided to make this disclosure complete and fully convey the scope of the present disclosure to a skilled in the art. Further, the present disclosure is only defined by the scopes of claims. In the drawings, the position and relative size of modules and units may be exaggerated for the clarification of description. Like reference numerals throughout the disclosure refer to like components.

In the following, exemplary embodiments of a current transformer (CT) system 1000 in which a sensor CT and a generator CT according to the present disclosure having the above-described configuration are installed in parallel to each other at an interval on a wire and an integrated system 2000 are described in detail with reference to the accompanying drawings.

Figure 1A:
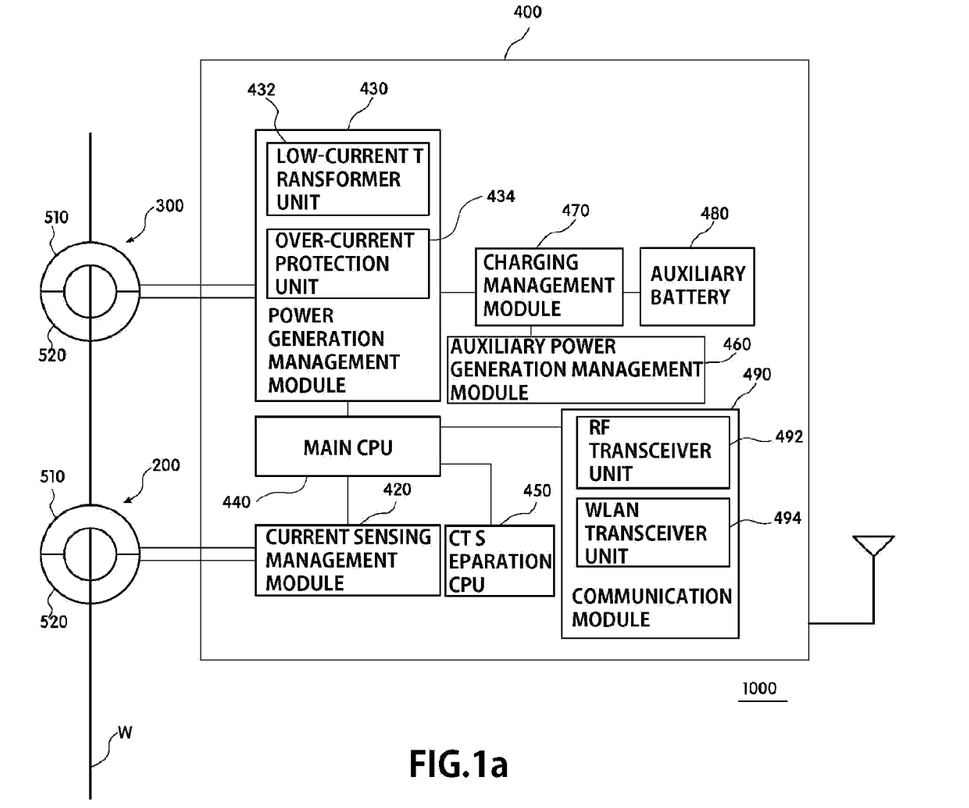
FIGS. 1a and 1b are block diagrams representing the configuration of a current transformer system in which a sensor current transformer (CT) and a generator CT are installed in parallel to each other at an interval on a wire according to the present disclosure.

Referring to FIG. 1a, the CT system 1000 of the present disclosure includes a sensor CT 200 that detects an abnormal current flowing through a power transmission/distribution wire W, a generator CT 300 that supplies power to the sensor CT 200, and a microprocessor 400 that controls a pair of CTs 200 and 300.

The CT system 1000 may use electromagnetic induction to sense an abnormal current and may also use the electromagnetic induction to generate power. The present disclosure transforms a high current flowing through the power transmission/distribution wire W into a low current to use it for current sensing and independent power generation.

Since there may be an electric shock or there is a fatal damage to an electrical device when the power transmission/distribution wire W has a short circuit or a trouble in load, a manager needs to check whether a current is abnormal.

The sensor CT 200 means a measurement circuit that receives power from the generator CT 300 and measures the above-described abnormal current flowing through the power transmission/distribution wire W. That is, the CT may transform, a value of current to be measured on the wire W, into a value of current proportional thereto.

The generator CT 300 means an independent power source supplying power to the sensor CT 200 and enables the CT system 1000 to operate without power supply from the outside. In particular, the generator CT 300 generates power in a contactless manner.

Figure 2A:
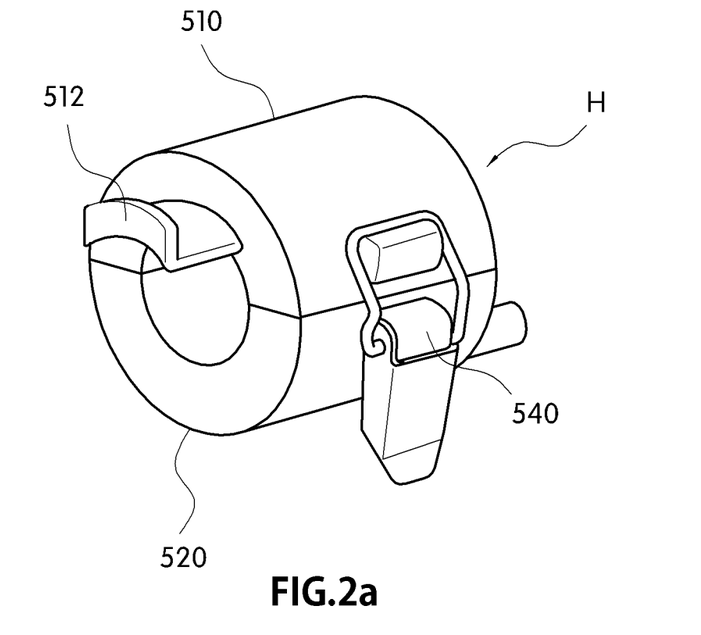
FIGS. 2a to 2c respectively are a closed perspective view, an opened perspective view and a usage state diagram of sensor CT and generator CT structures according to the present disclosure.
Figure 2B:
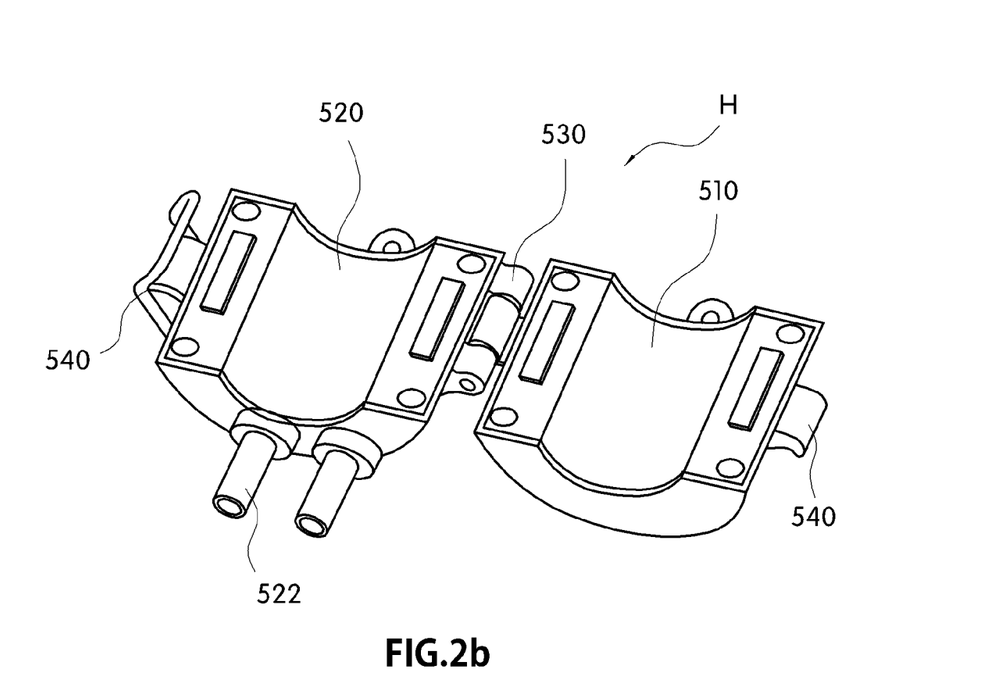
Figure 2C:
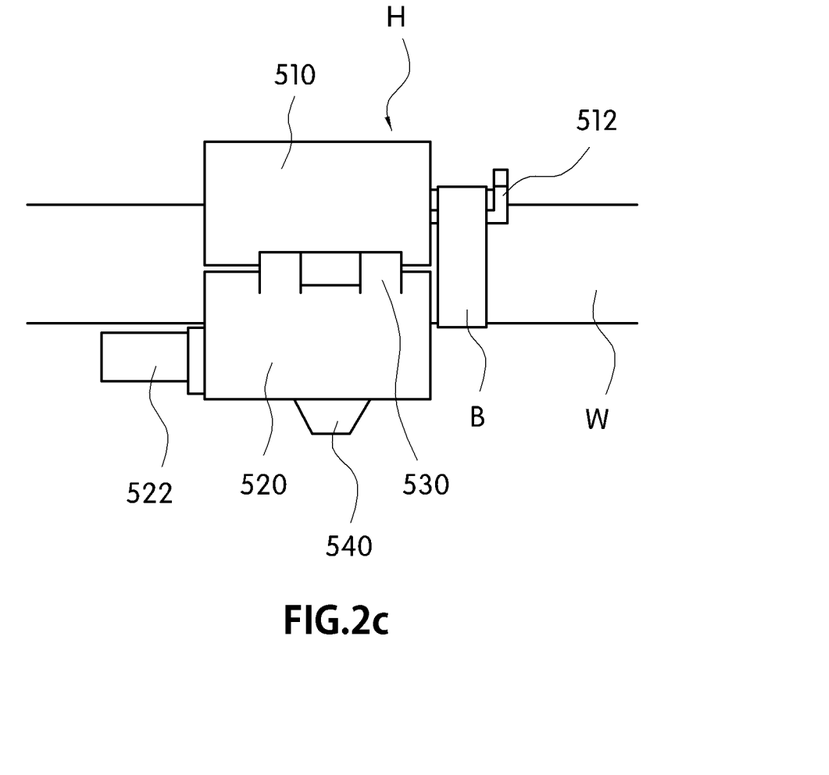

Referring to FIGS. 2a to 2c, the sensor CT 200 and the generator CT 300 include a core (not shown) and a coil (not shown) wound on the core and may transform a wire voltage of a high voltage and a high current into a wire voltage of a low voltage and a low current according to the number of coil windings. Each CT 200 or 300 of the present disclosure is of a ring type enabling detachment/attachment from/to the wire W and may be manufactured in a clamp-type structure H.

Such a structure H includes a top assembly 510, a bottom assembly 520, a hinge 530 to which a pair of assemblies 510 and 520 are rotatably coupled, and a lock clip 540 that selectively opens and closes the pair of assemblies 510 and 520. Each assembly 510 or 520 includes a core and a coil to generate electromotive force.

A current is generated by induced electromotive force generated from a current flowing through the wire W. If a large current flows through the wire W, a magnetic field is generated on the core of the generator CT 300 by the right hand rule of Ampere's law, induced electromotive force is generated on the coil by Faraday's law and thus power is generated. That is, a small current proportional to the large current of the wire W is generated and its principle is the same as in the sensor CT 200.

Induced electromotive force is also generated between the generator CT 300 and the sensor CT 200 and thus mutual interference occurs. Thus, the present disclosure is characterized in that the generator CT 300 and the sensor CT 200 are manufactured in individual structures H and installed in parallel to each other to prevent such interference.

A support rib 512 may be further disposed in front of the top assembly 510 so that the wire or a belt B fixing the structure H to the wire W is supported. A stopper 522 which maintains a certain distance between neighboring structures H to prevent the neighboring structures H from becoming tightly coupled by the nature of an electromagnet may be further disposed behind the bottom assembly 520.

According to such a structure H, since each CT 200 or 300 is separably manufactured in a detachable or attachable manner, it is convenient when there is a need to add each CT 200 or 300 to the wire W or remove it for replacement.

Figure 1B:
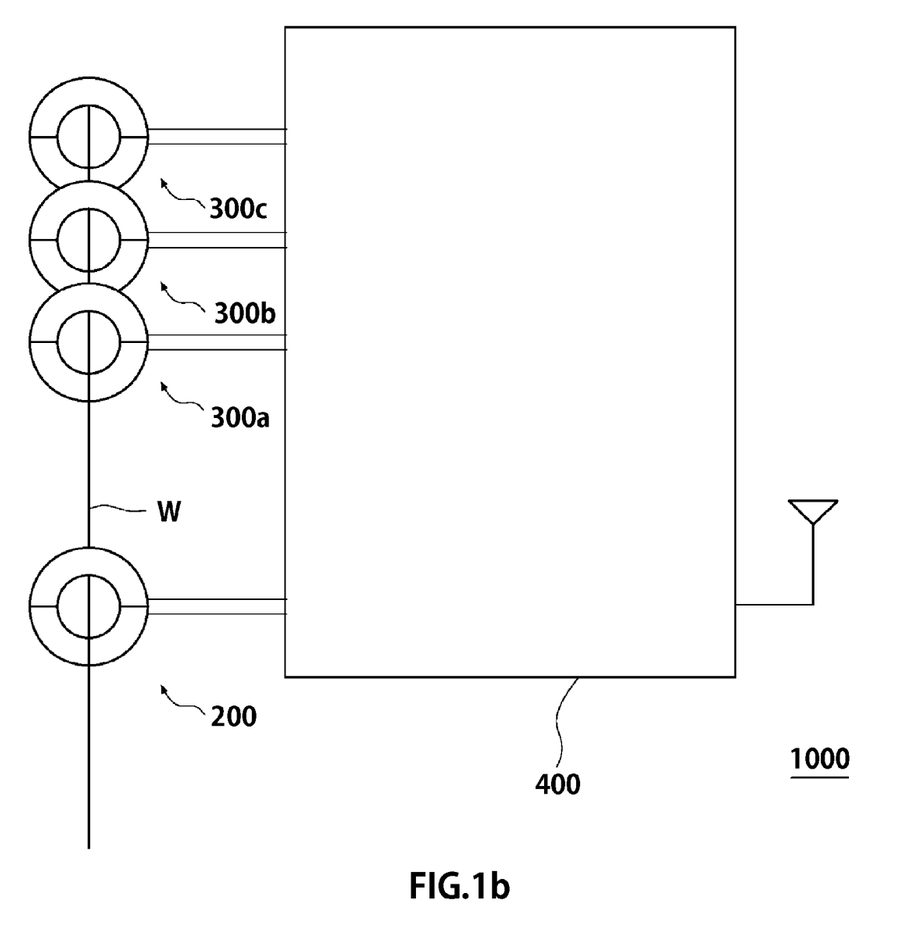

In particular, referring to FIG. 1b, the structure H does not need to be installed in singularity, and it is possible to install as many generator CTs 300a to 300c as needed for supplying power to the sensor CT 200.

Each CT 200 or 300 may further include a converter, though not shown. An AC/DC converter may convert alternating current (AC) power output from the generator CT 300 into direct current (DC) power and output the DC power. In addition, it is possible to further include a low pass filter (LPF) removing a harmonic signal, a regulator maintaining a constant voltage range, a filter removing noise and so on.

The microprocessor 400 includes a current sensing management module 420, a power generation management module 430, a main CPU 440, a CT separation CPU 450, an auxiliary power generation management module 460, a charging management module 470, an auxiliary battery 480, and a communication module 490.

The microprocessor 400 may be integrated with the sensor CT 200 or installed as a separate unit. If the microprocessor is installed on the wire W, it is possible to design so that the microprocessor 400 is mechanically coupled to one side of the bottom plate 520 of the structure H.

The current sensing management module 420 detects a current flowing through the wire W of a power transmission/distribution system through the sensor CT 200 and outputs a detected current signal to the main CPU 440. It is possible to convert the detected current signal into analog data or digital data and output the digital data.

The power generation management module 430 controls the generator CT 300 generating power in a contactless manner. The main power generation management module 430 may include a low voltage transformer unit 432 that transforms an induced voltage generated by the generator CT 300 into necessary power and an over-current protection unit 434. If there is an over-current or abnormal current such as a short circuit or electric leakage, the over-current protection unit 434 may prevent causing a serious damage to a load and so on. The over-current protection unit 434 senses it and automatically interrupts a circuit to protect the load and so on.

The main CPU 440 manages the operation of each module. In particular, a sensing value of current output from the sensor CT 200 is compared with a reference value of current and then it may be determined that there is an abnormal current when the sensing value of current exceeds the reference value of current.

The CT separation CPU 450 is used when the structure H is detached from the wire W. Since the structure H of the present disclosure is used for the power transmission/distribution wire W that has been typically installed and operated, a voltage and a current flow through the wire W. Since the present disclosure has been devised in order to easily detach/attach the structure H from/to a typical wire W through which a voltage and a current flow, it has a structure suitable for detachment/attachment. When being attached, it is possible to easily fix the structure to the wire W by using the lock clip 540 of the structure, but when being detached, the structure is not easily removed from the wire W with a physical force because the structure H is of an electromagnet type.

Thus, the CT separate CPU 450 needs to control the nature of an electromagnet. For example, the CT separation CPU 450 may remove magnetism from a core and thus easily remove the structure H from the wire W. When a switch is installed on a PCB to which the end of a coil is connected, the CT separation CPU 450 may turn on/off the switch to control the magnetism.

The auxiliary power generation management module 460 may be the generation management module of a solar cell (not shown) that converts solar energy into electrical energy. The solar cell includes a crystalline silicon solar cell, a thin film type (a-Si, CIGS, CdTe) solar cell, a dye-sensitized solar cell, an organic solar cell or the like and has no limitation as long as it is possible to generate energy by using sunlight.

The charging management module 470 may be the charging management module of a storage battery (not shown) that stores electrical energy generated from the generator CT 300 or solar cell (not shown). The storage battery may be a secondary battery or electric double layer capacitor that enables repetitive charging/discharging. The storage battery may supply power to the CT system 1000 while the generator CT 300 does not work, e.g., during wire power failure, or at night for which it is difficult to perform solar generation.

The auxiliary battery 480 may additionally supply power to the CT system 1000 in case of an emergency while the storage battery is also discharged.

The communication module 490 is required for enabling a manager to effectively control the sensor CT 200 of a contactless type remotely, receiving power from the generator CT 300 of an independent power source type. To this end, the communication module 490 may include an RF transceiver unit 492 and a WLAN transceiver unit 494.

The RF transceiver unit 492 is a communication module for short-range communication and may perform data communication with another CT system 1000 located within a relatively short range of several kilometers by using a middle frequency band. On the contrary, the WLAN transceiver unit 494 may be a communication module for wireless internet communication and perform data communication directly with a remote monitoring wireless integrated system 2000 to be described below through an adjacent wireless access point (AP) or smart phone (smart device) according to TCP/IP communication protocol.

Figure 3:
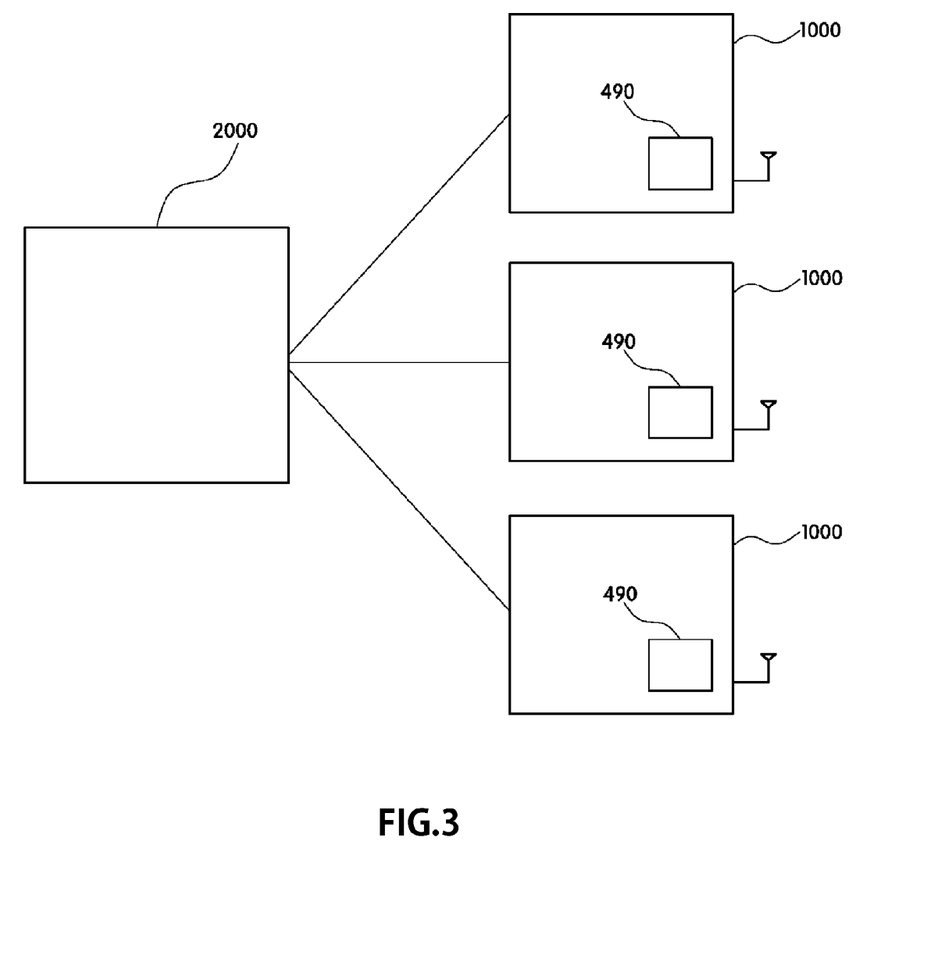
FIG. 3 is a block diagram representing the configuration of an integrated system that manages current transformer systems through a wireless communication network according to the present disclosure.

Referring to FIG. 3, the remote monitoring wireless integrated system 2000 that remotely monitors the load of the power transmission/distribution wire W by using a wireless communication network monitors the load state of the wire W in real time to immediately check an accident point in case of emergency so that a quick response is possible and as a result, a management cost may be reduced. Thus, the remote monitoring wireless integrated system 2000 may use the wireless communication network to form a network with a plurality of CT systems 1000.

As discussed above, it may be seen that a configuration in which the sensor CT sensing an abnormal current by using electromagnetic induction and the generator CT generating power are respectively manufactured in separate structures and installed in parallel to each other at a certain interval to prevent mutual interference is the technical spirit of the present disclosure. A person skilled in the art may implement many variations within the essential scope of the technical spirit of the present disclosure.

INDUSTRIAL APPLICABILITY

A CT system in which the sensor CT and the generator CT are installed in parallel to each other at an interval on a wire and an integrated system that manages the CT system through a wireless communication network may be widely applied to a CT.

The invention claimed is:

1. A current transformer (CT) system comprising:
a sensor CT installed detached/attached from/to a power transmission/distribution wire and detecting a current flowing through the wire by electromagnetic induction;
a generator CT installed detached/attached from/to the power transmission/distribution wire and generating power by electromagnetic induction;
wherein each of the sensor CT and each of the generator CT is discretely separate from each other so as to allow attachment or detachment from the wire independently of each other; and
a microprocessor controlling the sensor CT and the generator CT;
wherein each of the sensor CT and the generator CT comprises:
a top assembly in which a core and a coil are installed;
a bottom assembly corresponding to the top assembly;
a hinge to which the top assembly and the bottom assembly are rotatably coupled;
a lock clip selectively opening and closing the top assembly and the bottom assembly;
a support rib extended to a front of the top assembly and supporting a belt that fixes the structure to the wire; and
a stopper extended to a rear of the bottom assembly and maintaining a certain distance between neighboring structures to prevent the structure from becoming coupled to each other by magnetism.

2. The current transformer (CT) system of claim 1, wherein the sensor CT and the generator CT are installed in parallel to each other to be separated from each other.

3. The current transformer (CT) system of claim 2, wherein the generator CT generates independent power in a contactless manner.

4. The current transformer (CT) system of claim 3, wherein the generator CT is provided in plurality according to a necessary amount of power supplied to the sensor CT.

5. The current transformer (CT) system of claim 1, wherein the microprocessor is integrated with a structure for the sensor CT.

6. The current transformer (CT) system of claim 5, wherein the microprocessor comprises:
a current sensing management module outputting a current signal detected through the sensor CT;
a power generation management module transforming an inducted voltage generated by the generator CT into necessary power; and
a main CPU comparing a sensing value of current according to the current signal with a reference value of current to determine whether there is an abnormal current.

7. A current transformer (CT) system comprising:
a sensor CT installed detached/attached from/to a power transmission/distribution wire and detecting a current flowing through the wire by electromagnetic induction;
a generator CT installed detached/attached from/to the power transmission/distribution wire and generating power by electromagnetic induction;
wherein each of the sensor CT and each of the generator CT is discretely separate from each other so as to allow attachment or detachment from the wire independently of each other; and
a microprocessor controlling the sensor CT and the generator CT,
wherein the microprocessor is integrated with a structure for the sensor CT and the microprocessor further comprises a CT separation CPU removing magnetism from the core to separate a sensor CT structure from the wire;
wherein each of the sensor CT and the generator CT comprises:
a top assembly in which a core and a coil are installed;
a bottom assembly corresponding to the top assembly;
a hinge to which the top assembly and the bottom assembly are rotatably coupled;
a lock clip selectively opening and closing the top assembly and the bottom assembly;
a support rib extended to a front of the top assembly and supporting a belt that fixes the structure to the wire; and
a stopper extended to a rear of the bottom assembly and maintaining a certain distance between neighboring structures to prevent the structure from becoming coupled to each other by magnetism.

8. The current transformer (CT) system of claim 5, wherein the microprocessor comprises:
an auxiliary power generation management module for solar generation; and
a charging management module repetitively charging/discharging generation energy of the generator CT or the auxiliary power generation management module.

* * * * *